(12) United States Patent
Schimpf et al.

(10) Patent No.: US 8,330,223 B2
(45) Date of Patent: Dec. 11, 2012

(54) BIPOLAR TRANSISTOR

(75) Inventors: Klaus Schimpf, Freising (DE); Manfred Schiekofer, Freising (DE); Carl David Willis, Neusaess (DE); Michael Waitschull, Hallertau (DE); Wolfgang Ploss, Mauern (DE)

(73) Assignee: Texas Instruments Incorporated, Dallas, TX (US)

( * ) Notice: Subject to any disclaimer, the term of this patent is extended or adjusted under 35 U.S.C. 154(b) by 4 days.

(21) Appl. No.: 12/874,403

(22) Filed: Sep. 2, 2010

(65) Prior Publication Data

US 2011/0049517 A1 Mar. 3, 2011

(30) Foreign Application Priority Data

Sep. 2, 2009 (DE) .......................... 10 2009 039 744

(51) Int. Cl.
*H01L 27/12* (2006.01)

(52) U.S. Cl. . 257/350; 257/511; 257/555; 257/E21.382; 438/204

(58) Field of Classification Search .................. 438/189, 438/202, 204, 236; 257/21, 187, 350, 443, 257/462, 511, 512, 525, 555–562, E21.382
See application file for complete search history.

(56) References Cited

U.S. PATENT DOCUMENTS 6,972,237 B2 * 12/2005 Verma et al. .................. 438/312

FOREIGN PATENT DOCUMENTS

DE   10 2004 061 327 A1   8/2007

* cited by examiner

*Primary Examiner* — Benjamin Sandvik
*Assistant Examiner* — Scott R Wilson
(74) *Attorney, Agent, or Firm* — Wade J. Brady, III; Frederick J. Telecky, Jr.; Jacqueline J Garner

(57) ABSTRACT

A bipolar transistor has a collector having a base layer provided thereon and a shallow trench isolation structure formed therein. A base poly layer is provided on the shallow trench isolation structure. The shallow trench isolation structure defines a step such that a surface of the collector projects from the shallow trench isolation structure adjacent the collector.

8 Claims, 2 Drawing Sheets

BIPOLAR TRANSISTOR

FIELD OF THE INVENTION

The invention generally relates to a bipolar transistor. More particularly, the invention relates to a bipolar transistor or BiCMOS structure manufactured by non-selective epitaxy and a method of manufacture thereof.

BACKGROUND OF THE INVENTION

The use of non-selective silicon germanium (SiGe) epitaxy is one of the key processes in modern manufacturing technologies for bipolar transistors. Non-selective epitaxy defines the electrical properties of the bipolar base and makes high speed bipolar devices possible. During this non-selective deposition, single crystal SiGe is deposited on open silicon regions while poly SiGe is grown on oxide surfaces like shallow trench isolation structures (STI).

An example of an NPN transistor structure 10 manufactured by non-selective epitaxy is shown in FIG. 1. A collector C is formed as an epitaxial layer and etched so that shallow trench isolation structures STI are formed therein. After deposition of a gate poly layer G, the shallow trench isolation structures STI are etched. An epitaxial single crystal SiGe base layer B is deposited on the moat region M of the collector C and a poly SiGe gate layer BP is grown on the shallow trench isolation structures STI adjacent to and simultaneous with deposition of the base layer B. The emitter of this bipolar structure is not shown here.

However, because of the lattice mismatch between germanium and silicon, between the single crystal SiGe base layer B and the polysilicon gate regions BP, stress is induced in the epitaxial SiGe layers. This stress can result in defects such as dislocations.

It is an object of the invention to provide a bipolar transistor in which lattice defects are reduced or eliminated.

SUMMARY OF THE INVENTION

Accordingly, the invention provides a bipolar transistor. The bipolar transistor according to the invention includes a collector having a base layer provided thereon. The shallow trench isolation structure and the collector moat is defined such that the collector projects from the shallow trench isolation structure adjacent the collector. In other words, the surface of the collector region (this region is also often referred to as the moat region which refers to an area of silicon free of oxide although in this embodiment it is rather a plateau than a moat) protrudes from or extends above the shallow trench isolation structure. In this way, the shallow trench isolation structure step with respect to the collector is reversed (or, in other words, the thickness of the shallow trench isolation structure is reduced beyond the level of the collector plateau). This provides that the stress between the poly base region and the single crystal epitaxial base region is reduced. Therefore defects such as dislocations are eliminated or reduced.

In one embodiment of the invention, the base layer and the poly base layer may be formed from SiGe. Further, the base layer may be single crystal SiGe, while the base poly layer will be poly SiGe. Since there is a mismatch between the SiGe base layer and the Si collector, stress is implemented especially at the interface between the SiGe base layer and the SiGe base poly, that are grown simultaneously. Because the shallow trench isolation structure further defines a step such that the collector projects from the shallow trench isolation structure adjacent to the collector in the transistor according to the invention, stress between the poly SiGe layer and the single crystal SiGe layer is reduced so that defects are minimized.

The invention also provides a method of manufacturing a bipolar transistor. The method comprises forming a shallow trench isolation structure in the collector and etching the shallow trench isolation structure. Further, the step of etching comprises defining a step in the shallow trench isolation structure such that the collector projects from the shallow trench isolation structure adjacent the collector. This means that when the base layer is deposited on the collector and the base poly is deposited on the etched shallow trench isolation structure, the base layer projects or protrudes from the collector by an amount greater than the part of the base poly that is situated adjacent to the base layer. In this way, stress between the base layer and the base poly layer is minimized, which means that defects in the transistor structure are eliminated or reduced compared to a bipolar transistor manufactured by conventional non-selective epitaxial processes. The etching step may be a wet etching step. After the etching step, SiGe can be deposited for forming the base of the transistor through epitaxial growth. SiGe may then also be deposited on the shallow trench isolation regions, where the SiGe forms a poly SiGe layer. The stress at the interface between epitaxial SiGe and poly SiGe can then be reduced.

In an aspect of the invention, a step of back etching the shallow trench isolation structure adjacent to the collector region is provided. This step of back etching the shallow isolation structure can be extended beyond a conventional etching step that may be due to removing a gate oxide from the collector. The back etching step can then intentionally be extended to remove not only the gate oxide but also so as to invert the step from moat to shallow trench isolation from positive (shallow trench isolation higher than moat) to negative (shallow trench isolation lower than moat).

The etching loss of the shallow trench isolation adjacent to the collector region may be increased to a value greater than 100 Å (1 Å=1 angstrom=$1*10^{-10}$ m). A conventional etching step of the shallow trench isolation may be around 50 Å. However, in an advantageous embodiment, the etching loss of the shallow trench isolation adjacent to the collector region may be several hundred Å or more.

Furthermore, the time for etching the shallow trench isolation back may also be extended. The etching time may be twice the conventional etching time ore more. Etching the shallow trench isolation structure to an amount and/or for a time in this range advantageously reduces the step height of the shallow trench isolation structure so that the collector projects from the shallow trench isolation structure by an amount that further minimizes stresses between the base layer and the gate. Therefore defects in the transistor structure are further reduced.

The bipolar transistor and method of manufacture thereof according to the invention may apply to either an NPN or a PNP bipolar transistor. The method of manufacture according to the invention may be used for the manufacture of all bipolar transistors without affecting the epitaxial profile, for example Ge or doping concentration. Furthermore, the invention may also be employed in BiCMOS technology, where bipolar and CMOS transistors are grown on the same wafer.

An embodiment of the invention will now be described, by way of example only, and with reference to the accompanying drawings, in which:

DETAILED DESCRIPTION OF AN EXAMPLE EMBODIMENT

Figure 1:
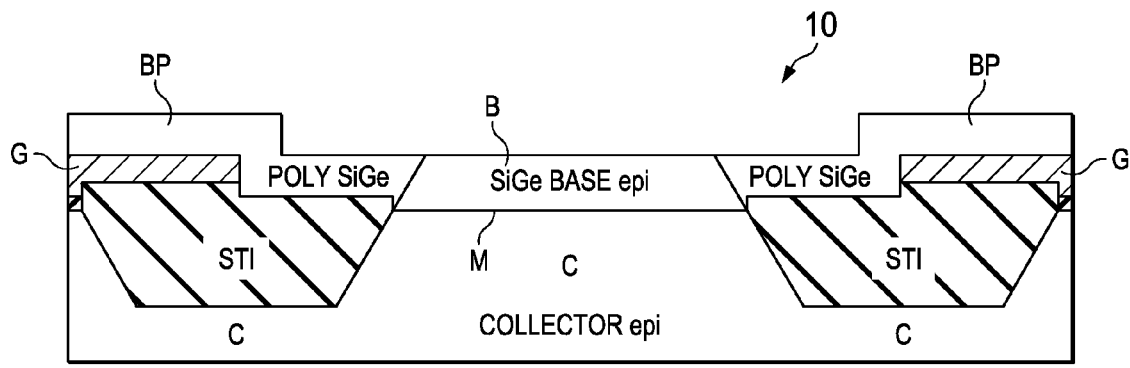
FIG. 1 is a simplified side cross-sectional view of the collector and the base regions of a bipolar transistor manufactured by a conventional non-selective silicon germanium epitaxial process in a BiCMOS technology.
Figure 2:
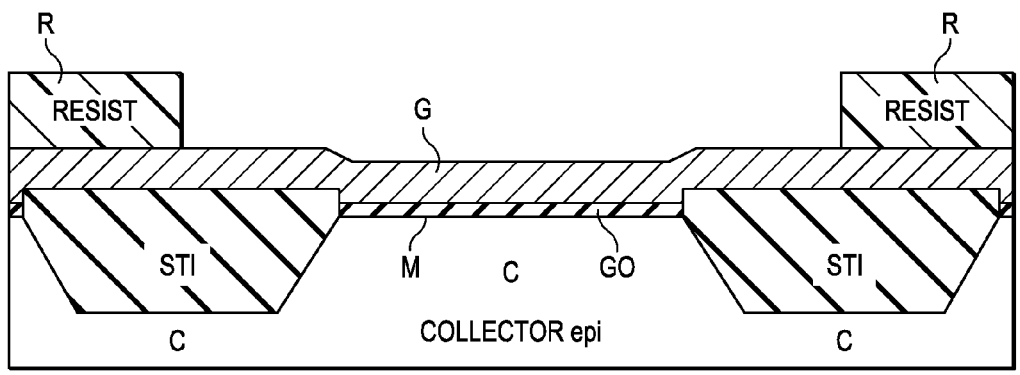
FIG. 2 is a simplified side cross-sectional view of a manufacturing step of a bipolar transistor in a method of manufacture according to the invention.
Figure 3:
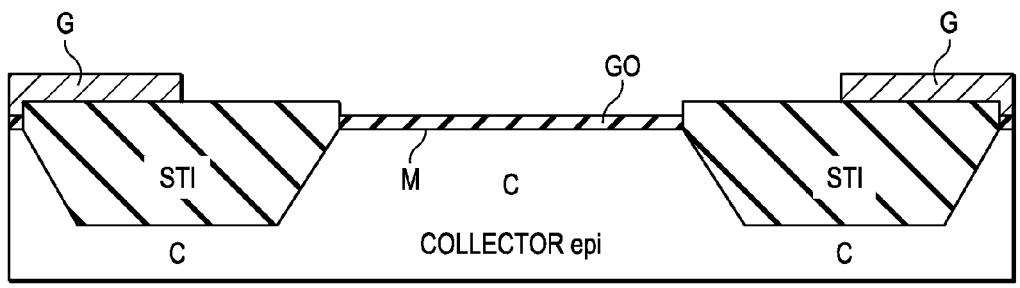
FIG. 3 is a simplified side cross-sectional view of a manufacturing step of a bipolar transistor in a method of manufacture according to the invention.
Figure 4:
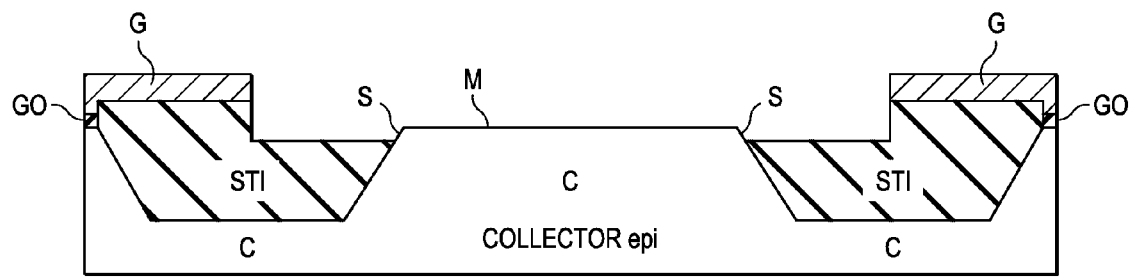
FIG. 4 is a simplified side cross-sectional view of a manufacturing step of a bipolar transistor in a method of manufacture according to the invention.
Figure 5:
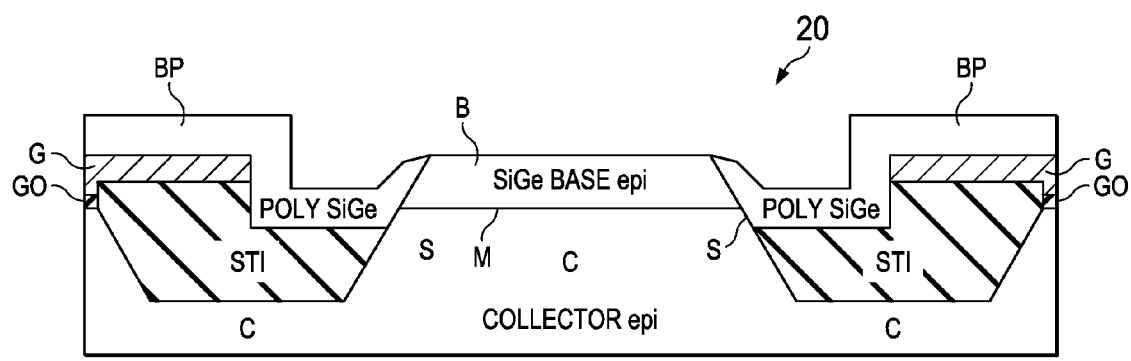
FIG. 5 is a simplified side cross-sectional view of the collector and the base regions of a bipolar transistor according to the invention.

FIG. 5 shows the collector and the base regions of a bipolar transistor 20 according to the invention and FIGS. 2 to 4 are cross-sectional views at various steps in the manufacture or process flow of the bipolar transistor 20 according to the invention. Only the manufacturing steps that are applicable to the invention are described in detail in the following. Especially the fabrication of the emitter on top of the base is not described herein as it corresponds to standard processing. Although only the manufacture of an NPN transistor is shown and described here, the invention and described method of manufacture could also apply to a PNP bipolar transistor, or any bipolar transistor in a BiCMOS structure.

FIG. 2 shows a stage of manufacture of the bipolar transistor 20 after the formation of shallow trench isolation, gate oxide and gate poly deposition (gate oxide and gate poly are not part of the bipolar transistor. They are only required for the CMOS devices which are also fabricated in BiCMOS process flows). Shallow trench isolation structures STI are formed in a collector C on either side of a moat region M. A gate oxide layer GO is formed on top of the moat region M on the collector C in the areas where there are no shallow trench isolation structures STI. A gate poly layer G and photo resist pattern R for defining the active bipolar area are deposited on top of the gate oxide layer GO and shallow trench isolation structures STI.

In FIG. 3, the bipolar area is defined by removal of the gate poly layer G using the resist patterning, poly etch and removal of the photo resist R. This manufacturing step leaves some of the gate poly layer G partly covering the shallow trench isolation structures STI in the regions of the STIs furthest away from the moat region M on the surface of the collector C. After this step, the shallow trench isolation structures STI project from (or, from the point of reference as shown here in the Figures, protrude above) the collector surface (the moat region M).

FIG. 4 shows a step of removing the gate oxide layer GO by etching, for example using an HF etch. This step of etching involves removing not only the gate oxide GO but also some of the shallow trench isolation structures STI. The etching step is timed so that a step S is formed in each of the shallow trench isolation structures STI having a depth such that the moat region M of the collector C projects or extends from the surface of the shallow trench isolation structures STI. In other words the length of time of the etching step is extended compared to that of the conventional bipolar transistor manufacturing methods so that the step from the moat M to the shallow trench isolation structures STI is negative and the shallow trench isolation structures STI are lower than the moat M.

In FIG. 5, completion of the bipolar base 20 is shown, whereby, after cleanup of the surface of the structure shown in FIG. 4, an epitaxial SiGe layer is deposited over the collector C, which results in a polysilicon SiGe base layer BP on top of the shallow trench isolation structures STI and a single crystal SiGe base layer B on the moat region M. Due to the extended etching step, with the step from the moat M to the shallow trench isolation structures STI being negative, the shape of the polysilicon layer at the interface between the base poly regions BP and the base B is such that the base layer B projects from the collector C by an amount greater than the part of the base poly regions BP next to the base B.

It can be measured that the percentage of failing transistors can significantly decrease in the manufacture of both NPN and PNP transistors with a larger added etch time. This is because a longer etch time leads to a negative step from the moat M to the shallow trench isolation structures STI; i.e., the collector C protrudes above the shallow trench isolation structures STI in the moat region M by a larger amount for longer etch times. In this way, when the epitaxial SiGe layer is deposited on top of the collector C, the stress between the single crystal SiGe base layer B and the polysilicon SiGe base poly regions B is further reduced, which leads to an even greater reduction in defects.

The etching time for NPN and PNP devices may be different depending on the used etch solvent and the process integration scheme.

The etching loss of STI should be greater than 100 Å. It may advantageously be several hundred Å.

The step height between the STI region and the moat region M may be about 100 Å or more before etching and about minus 100 Å or more after etching.

Although the invention has been described with reference to a specific embodiment, it is not limited to this embodiment and no doubt further alternatives will occur to the skilled person that lie within the scope of the invention as claimed.

The invention claimed is:

1. A bipolar transistor, comprising a collector having a base layer provided thereon and a shallow trench isolation structure formed therein, and a base poly provided on the shallow trench isolation structure, wherein the shallow trench isolation structure defines a step such that a surface of the collector projects from the shallow trench isolation structure adjacent the collector.

2. The bipolar transistor according to claim 1, wherein the base poly is a polysilicon layer.

3. The bipolar transistor according to claim 1, wherein the base layer and the base poly are formed from SiGe.

4. The bipolar transistor according to claim 3, wherein the base layer is formed from single crystal SiGe.

5. A method of manufacturing a bipolar transistor, the method comprising:
   forming a shallow trench isolation structure in the collector;
   etching the shallow trench isolation structure; and
   growing an epitaxial layer over the collector that forms a base layer on a collector and a base poly layer on the etched shallow trench isolation structure,
   wherein the step of etching comprises defining a step in the shallow trench isolation structure such that the collector projects from the shallow trench isolation structure adjacent the collector.

6. The method of claim 5, wherein the step for growing the epitaxial layer grows a SiGe epitaxial layer such that the base layer comprises a single crystal SiGe layer and the base poly layer comprises polysilicon SiGe.

7. The method of claim 5, further comprising the steps of:
forming a gate oxide layer over the collector;
forming a gate layer over the gate oxide, and
patterning and etching to remove the gate layer from over at least a portion of the collector, wherein said step of etching the shallow trench isolation comprises etching to remove the gate oxide layer from over the at least a portion of the collector to define said step in the shallow trench isolation structure.

8. A method of manufacturing a bipolar transistor, the method comprising:
forming a collector;
forming a shallow trench isolation structure in the collector;
etching the exposed portion of the shallow trench isolation structure to define a step in the shallow trench isolation structure such that a horizontal surface of the collector projects above the shallow trench isolation structure adjacent the collector; and
after etching the exposed portion of the shallow trench isolation structure, forming an epitaxial layer over the collector that forms a base layer on and in direct contact with the horizontal surface of the collector and a base poly layer on the etched portion of the shallow trench isolation structure.

* * * * *